(12) United States Patent
Lee

(10) Patent No.: US 8,202,443 B2
(45) Date of Patent: Jun. 19, 2012

(54) METHOD OF MANUFACTURING A CAPACITOR

(75) Inventor: Geun Su Lee, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 31 days.

(21) Appl. No.: 12/833,389

(22) Filed: Jul. 9, 2010

(65) Prior Publication Data

US 2010/0317171 A1 Dec. 16, 2010

Related U.S. Application Data

(62) Division of application No. 11/784,284, filed on Apr. 6, 2007, now abandoned.

(30) Foreign Application Priority Data

Jan. 5, 2007 (KR) .................. 10-2007-0001410

(51) Int. Cl.
*B44C 1/22* (2006.01)

(52) U.S. Cl. ............... 216/96; 216/83; 216/88; 216/89; 438/745; 252/79.1; 252/79.2; 252/79.3

(58) Field of Classification Search ............ 216/83, 216/88, 89, 96; 438/745; 252/79.1, 79.2, 252/79.3
See application file for complete search history.

(56) References Cited

U.S. PATENT DOCUMENTS

| | | | |
|---|---|---|---|
| 5,972,862 A | 10/1999 | Torii et al. | |
| 6,387,859 B1 | 5/2002 | Ho | |
| 6,677,286 B1 | 1/2004 | Rovito et al. | |
| 6,773,873 B2 | 8/2004 | Seijo et al. | |
| 6,777,380 B2 | 8/2004 | Small et al. | |
| 7,056,447 B2 | 6/2006 | Gilton | |
| 7,311,857 B2 | 12/2007 | Ko et al. | |
| 7,605,113 B2 * | 10/2009 | Wojtczak et al. | 510/175 |
| 2004/0177867 A1 | 9/2004 | Schilling | |
| 2004/0204328 A1 | 10/2004 | Zhang et al. | |
| 2005/0003977 A1 * | 1/2005 | Itano et al. | 510/175 |
| 2005/0202987 A1 | 9/2005 | Small et al. | |
| 2005/0209118 A1 | 9/2005 | Kawamoto et al. | |
| 2006/0183297 A1 * | 8/2006 | Mun et al. | 438/459 |
| 2007/0145009 A1 * | 6/2007 | Fucsko et al. | 216/83 |

FOREIGN PATENT DOCUMENTS

KR 10-2007-0121309 12/2007

* cited by examiner

*Primary Examiner* — Shamim Ahmed
(74) *Attorney, Agent, or Firm* — Marshall, Gerstein & Borun LLP (57) ABSTRACT

An etching composition for preventing from leaning a capacitor contains hydrofluoric acid (HF), ammonium fluoride ($NH_4F$), an alkyl ammonium fluoride ($R_eNH_3F$; where $R_e$ is a $C_1$-$C_{10}$ linear or branched alkyl radical), a surfactant, an alcohol compound, and water. The composition can effectively suppress the leaning phenomenon of capacitors during the formation of the capacitors, so that height of the storage node of the capacitor can be secured, capacitors with improved capacitance can be manufactured, and the process can be adapted to the production of both present and future devices.

15 Claims, 7 Drawing Sheets

Fig.1a

[Prior art]

Fig.1b

[Prior art]

Fig.1c

[Prior art]

METHOD OF MANUFACTURING A CAPACITOR

CROSS-REFERENCE TO RELATED APPLICATIONS

This is a division of U.S. application Ser. No. 11/784,284 filed Apr. 6, 2007, now abandoned, which claims the priority benefit under 35 U.S.C. §119 from Korean Patent Application No. 2007-1410, filed on Jan. 5, 2007, the entire respective disclosures of which are incorporated herein by reference.

BACKGROUND OF THE INVENTION

1. Field of the Invention

The disclosure relates to a composition for preventing from leaning a capacitor in a semiconductor device, and a method for manufacturing a capacitor using the same.

2. Description of the Related Art

As the demand for semiconductor devices increases, various techniques for manufacturing a capacitor with a high capacitance have been suggested.

In the capacitor, a dielectric film is interposed between a lower electrode as a storage node and an upper electrode as a plate node. The capacitance of the capacitor is proportional to the surface area of the electrode and the dielectric constant of the dielectric film, and it is inversely proportional to the gap between the electrodes (i.e., the thickness of the dielectric film). A method using a dielectric film with a large dielectric constant, a method for reducing the thickness of a dielectric film, a method for increasing the surface area of the lower electrode, and a method for reducing the gap between electrodes have been used to manufacture a capacitor with a high capacitance.

However, with an increasing degree of integration, the size of the semiconductor memory device has been gradually reduced. It is thus difficult to manufacture a capacitor with a sufficient capacitance. Accordingly, research has been steadily conducted to improve the structure of the storage node. Concave-type and cylinder-type capacitors with a three-dimensional structure have been developed as a solution. Recently, the cylinder-type capacitor using both the internal area and the external area as the node area has been more popularly used than the concave-type capacitor using only the internal area as the node area.

Figure 1A:
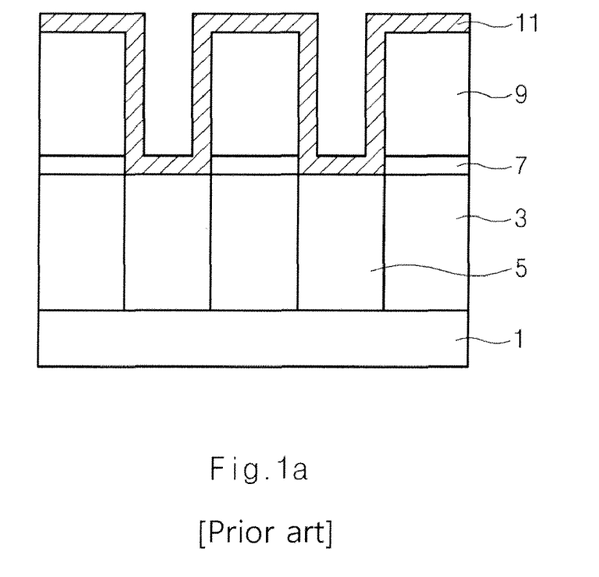
FIGS. 1a to 1c illustrate a conventional manufacturing method for cylinder-type capacitors.
Figure 1B:
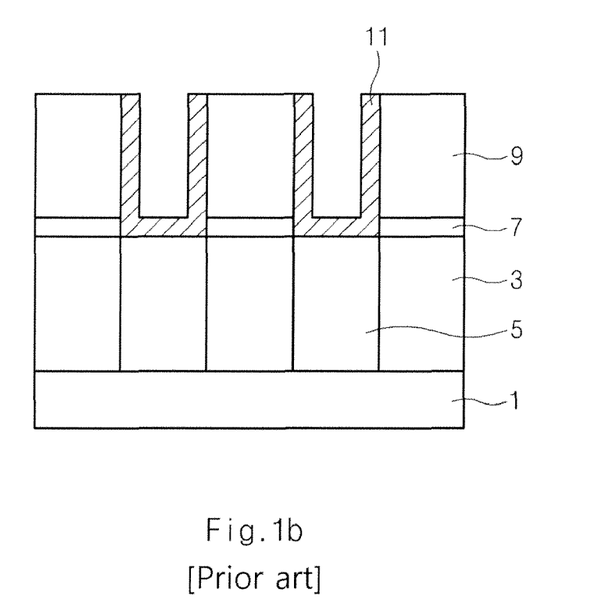

Hereinafter, a conventional method of manufacturing a capacitor for a semiconductor device will be explained with reference to the accompanying drawings. FIG. 1a and FIG. 1b briefly illustrate a manufacturing process for a three-dimensional cylinder-type capacitor according to a conventional method.

FIG. 1a shows that an interlayer insulating film 3 is formed over a semiconductor substrate 1 having a semiconductor circuit such as transistors (not shown) and bit lines (not shown), and the interlayer insulating film 3 is etched to form storage node contact holes (not shown) to expose part of the semiconductor substrate 1.

Then, the storage node contact holes are filled with storage node contact plugs 5. Moreover, a nitride film 7 used as an etching barrier film, and a capacitor oxide film 9 determining the height of a lower electrode are deposited sequentially on the top surface of the interlayer insulating film 3 containing the storage node contact plugs 5.

The capacitor oxide film 9 is dry etched to form a trench (not shown) used for a storage node, and then a lower electrode 11 used for a storage node is formed inside the trench.

FIG. 1b shows that the lower electrode 11 used for a storage node undergoes a chemical mechanical polishing process or an etch-back process until the capacitor oxide film 9 is exposed to isolate the remaining portions of the lower electrode 11.

Figure 1C:
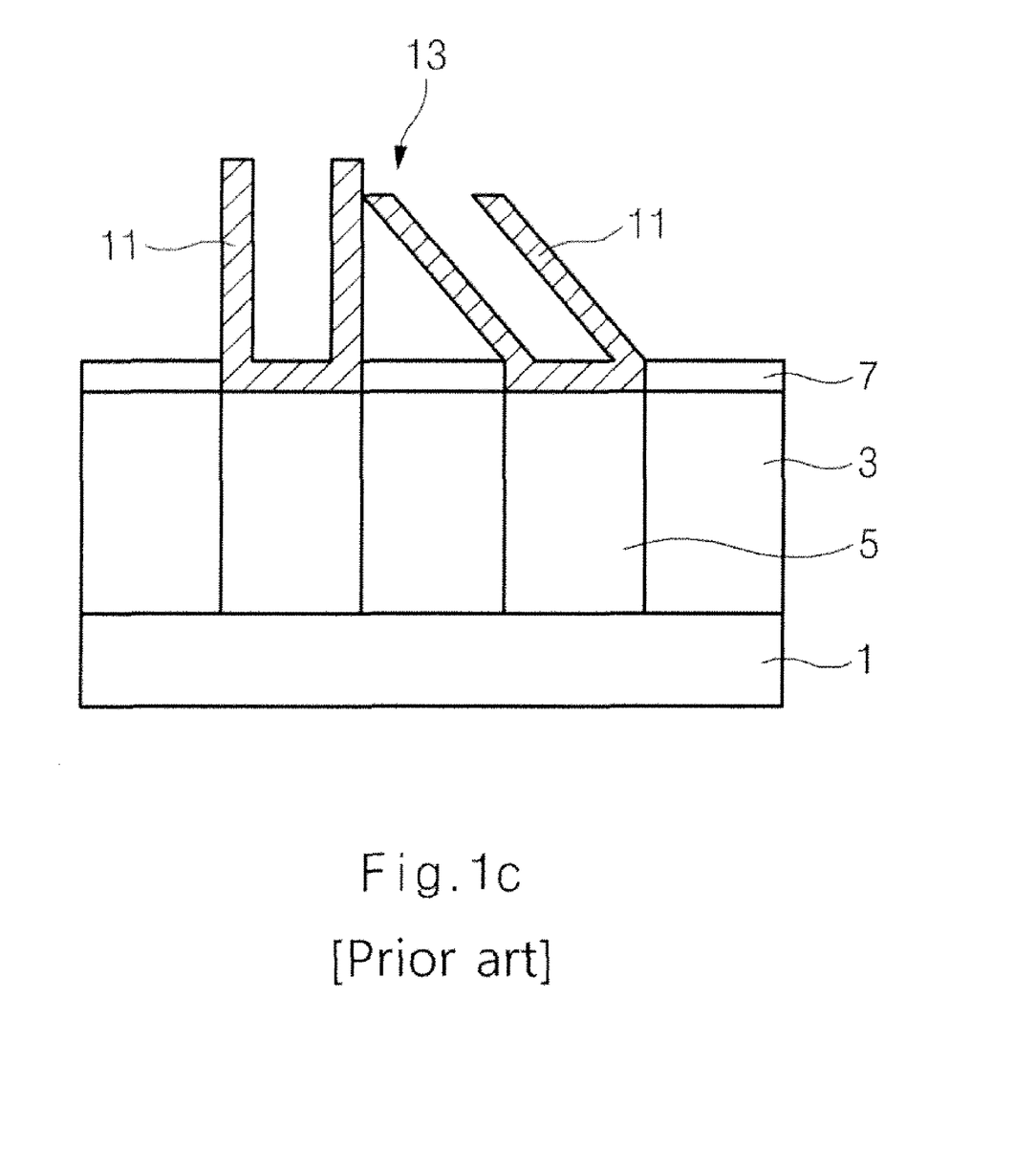

FIG. 1c shows that the capacitor oxide film 9 is removed by a wet-dip out process, in which the resultant structure of FIG. 1b is immersed and wet etched at a room temperature of 23° C. for about 25 minutes. The wet etching solution is an $HF/NH_4F$ solution prepared by mixing deionized water and $HF/NH_4F$ (manufactured by Techno Semichem Co., Ltd, Product Name: LAL400) at a volume ratio of 20:1. The structure is then sufficiently washed with deionized water, and placed in a vapor of isopropyl alcohol to be dried.

However, a reduced or finer design rule has resulted in a decrease in floor space at the time of formation of the storage node of a cylinder-type capacitor. Therefore, in an attempt to secure the capacitance of the capacitor, the capacitor oxide film 9 is formed to greatly increase the surface area of the lower electrode 11. This causes an increase in the aspect ratio of the lower electrode 11.

Figure 2:
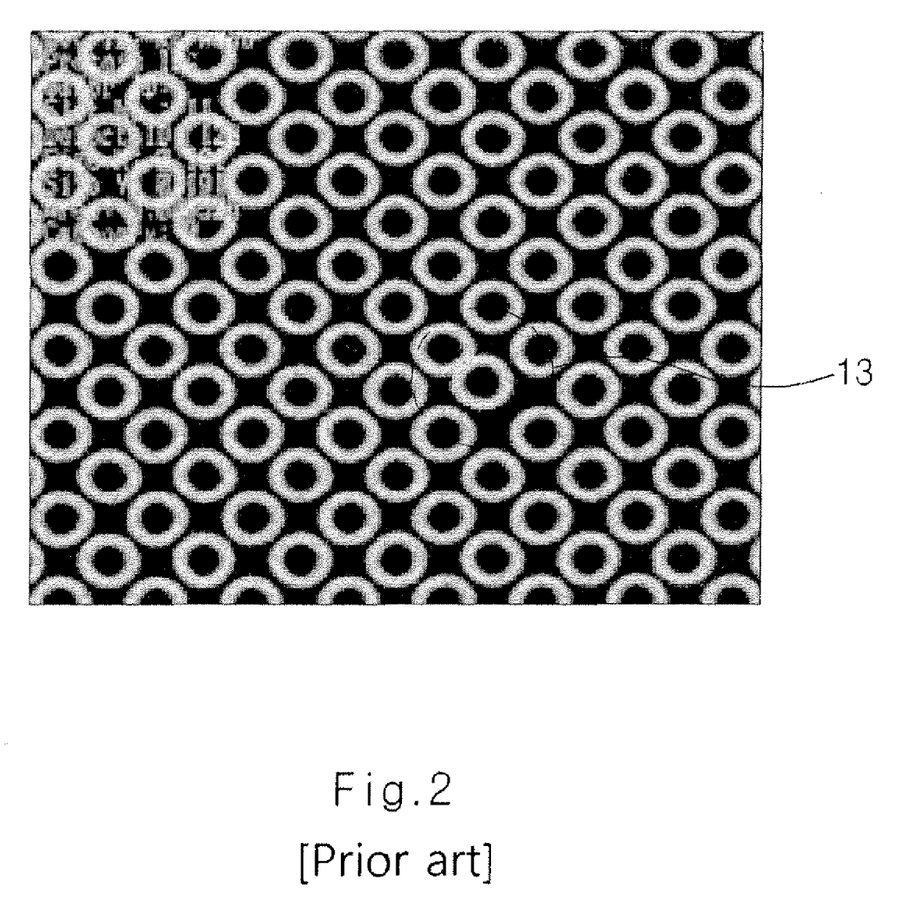
FIG. 2 is an SEM photograph illustrating the leaning phenomenon occurring between adjacent lower electrodes during the manufacturing of a capacitor according to the conventional method.

Consequently, during the drying step for removing moisture infiltrated between the lower electrodes 11 during the wet-dip out process for removing the capacitor oxide film 9, surface tension occurring between adjacent lower electrodes 11 leads to the frequent occurrence of a leaning phenomenon 13 in which the lower electrodes come in contact with each other and are bridged, as illustrated in FIG. 2. Unfortunately, the leaning phenomenon worsens with a decrease in the distance (i.e., line width) between capacitors. A narrower line width floor for a capacitor or an increased capacitor height is a result of the size reduction of semiconductor devices. This problem results in serious failures during the manufacturing process, reducing final production yields of semiconductor memory devices.

So far, an aspect ratio of 11 is best for enabling the manufacturing of 60 nm devices. In order to satisfy that the capacitance required for the cell is larger than $25*10^{-15}$, particularly for the operation of a device having a line width of 50 nm or less, the aspect ratio is expected to be 20 or larger.

SUMMARY OF THE INVENTION

In view of the foregoing problems, a wet etching composition (wet etchant) for effectively preventing the leaning phenomena between lower electrodes during the manufacturing of cylinder type capacitors is disclosed.

In addition, a manufacturing method for a capacitor using the wet etching composition and a semiconductor device manufactured by the manufacturing method are provided to improve device reliability while also securing sufficient capacitance to meet the requirements of highly integrated devices.

To achieve the above objects and advantages, an etchant composition for preventing from leaning a capacitor is disclosed. The composition contains hydrofluoric acid (HF), ammonium fluoride ($NH_4F$), an alkyl ammonium fluoride ($R_eNH_3F$, where $R_e$ is a $C_1$-$C_{10}$ linear or branched alkyl radical), a surfactant, an alcohol compound, and water.

Another aspect of the disclosed invention provides a manufacturing method of a capacitor, including the steps of: forming a barrier film and a capacitor oxide film over a semiconductor substrate having an interlayer insulating film containing storage node contact plugs; etching the capacitor oxide film and the barrier film to form a trench thereby exposing the storage node contact plugs and a peripheral portion of the interlayer insulating film; forming a lower electrode used for a storage node inside the trench, thereby covering the capacitor oxide film; forming an isolated lower electrode by removing a portion of the lower electrode until the capacitor oxide film is exposed; rinsing the resultant structure with an alcohol; and, drying the resultant structure.

Additional and/or other aspects and advantages of the disclosed invention are set forth in part in the following description and, in part, will be obvious from the description, or may be learned by practice of the invention.

BRIEF DESCRIPTION OF THE DRAWINGS

The above aspects and features of the disclosure will be more apparent by describing certain embodiments with reference to the accompanying drawings, in which.

DETAILED DESCRIPTION OF THE PREFERRED EMBODIMENTS

A preferred embodiment of the disclosure is described with reference to the accompanying drawings.

A wet etching composition contains hydrofluoric acid (HF), ammonium fluoride ($NH_4F$), an alkyl ammonium fluoride ($R_eNH_3F$, where $R_e$ is a $C_1$-$C_{10}$ linear or branched alkyl radical), a surfactant, an alcohol compound, and water.

The composition may further contain one or more acid compounds such as sulfuric acid, phosphoric acid, nitric acid, formic acid, and acetic acid. When these acids are used, the etching selectivity ratio can be freely adjusted.

The hydrofluoric acid (HF) in the etching composition etches an oxide film, such as a PE-TEOS oxide film and the like. Preferably, the HF content ranges from 0.1 weight parts to 5 weight parts based on 100 weight parts of the etchant composition. If the HF content is less than 0.1 weight parts, the etch rate is decreased. Meanwhile, if the HF content is greater than 5 weight parts, the etching selectivity ratio is lowered, retention stability is degraded, and handling risks are increased.

The ammonium fluoride ($NH_4F$) in the etching composition helps to control the etch rate. Preferably, the $NH_4F$ content ranges from 1 weight part to 40 weight parts based on 100 weight parts of the etching composition. If the $NH_4F$ content is less than 1 weight part, it becomes difficult to control the etching rate of the oxide film. Meanwhile, if the $NH_4F$ content is greater than 40 weight parts, the etch rate is decreased and a precipitate (($NH_4$)$_2SiF_6$) is produced.

The alkyl ammonium fluoride ($R_eNH_3F$, where $R_e$ is a $C_1$-$C_{10}$ linear or branched alkyl radical) in the etching composition, similar to the ammonium fluoride ($NH_4F$), also helps to control the etch rate. Preferably, the $RNH_3F$ content ranges from 1 weight part to 40 weight parts based on 100 weight parts of the etching composition. If the $R_eNH_3F$ content is less than 1 weight part, the $NH_4F$ content is relatively high, and unnecessarily excessive precipitate is produced.

Meanwhile, if the $R_eNH_3F$ content is greater than 40 weight parts, the etch rate is substantially reduced.

Examples of the surfactant include non-ionic surfactants, cationic surfactants, and anionic surfactants. Preferably, the surfactant content ranges from 100 ppm to 10000 ppm, based on the weight of the etching composition.

Preferred examples of the surfactant are represented by Formula 1 and Formula 2 below:

[Formula 1]

In Formula 1, R is a $C_8$-$C_{20}$ alkyl radical or $C_6$-$C_{20}$ aromatic ring; x, y, and z are integers independently ranging from 0 to 10; n is an integer ranging from 3 to 50. The average molecular weight of a compound according to Formula 1 ranges from 1,000 to 10,000.

[Formula 2]

In Formula 2 μm is an integer ranging from 3 to 50. The average molecular weight of a compound according to Formula 2 ranges from 1,000 to 10,000.

The alcohol compound in the etching composition adjusts the solubility of other components in the etching composition and influences the etch rate. Preferably, the alcohol compound content ranges from 1 weight part to 80 weight parts based on 100 weight parts of the etching composition. If the alcohol compound content is less than 1 weight part, the solubility of $R_eNH_3F$ having a long alkyl radical is lowered. Meanwhile, if the alcohol compound content is greater than 80 weight parts, the solubility of $NH_4F$ is lowered.

The water is present in an amount ranging from 20 weight part to 80 weight parts based on 100 weight parts of the etching composition.

The etching composition of the disclosure preferably has a surface tension between 16 dyn/cm and 50 dyn/cm, more preferably between 16 dyn/cm and 25 dyn/cm, at a temperature of 23° C.

Figure 3A:
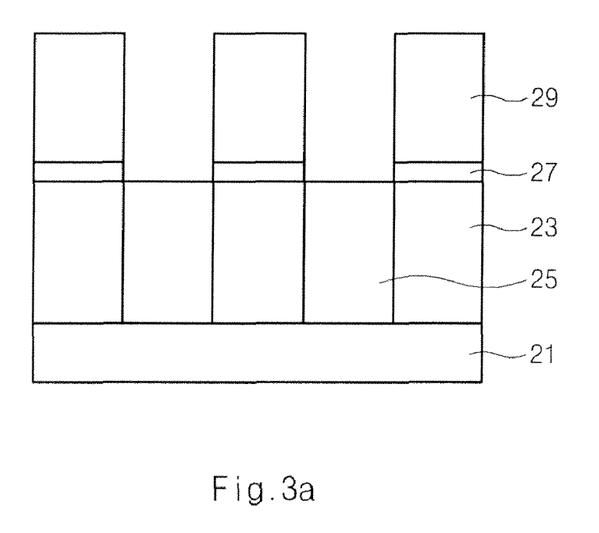
FIGS. 3a to 3d illustrate a manufacturing method for cylinder-type capacitors according to the disclosure.
Figure 3B:
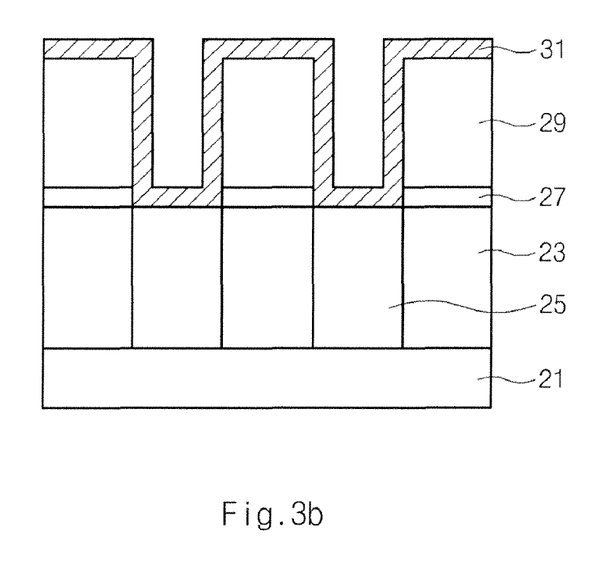
Figure 3C:
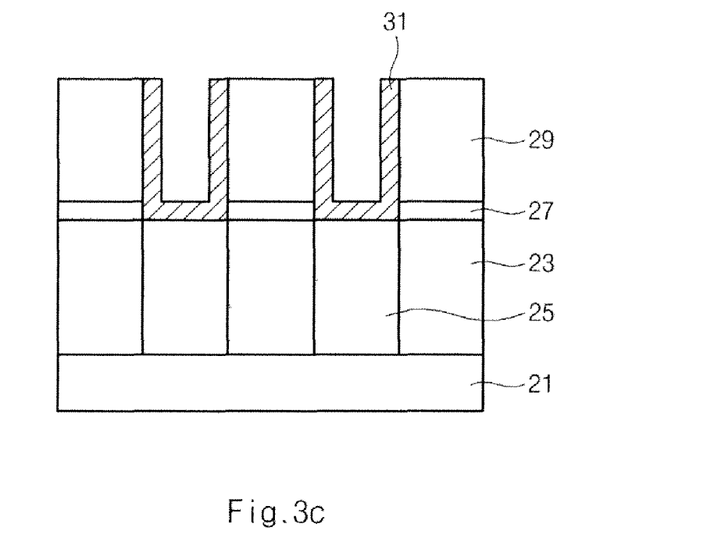

The following describes, with reference to FIGS. 3a-3c, a method for manufacturing a capacitor using the disclosed etching composition.

FIG. 3a illustrates an interlayer insulating film 23 formed over a semiconductor substrate 21 having a semiconductor circuit such as transistors (not shown) and bit lines (not shown). The interlayer insulating film 23 is etched to form storage node contact holes (not shown), thereby exposing part of the semiconductor substrate 21.

Then, the storage node contact holes are filled with storage node contact plugs 25. A barrier film 27 (e.g., a nitride film used as an etching barrier film), and a capacitor oxide film 29 (which determines the height of a lower electrode) are then deposited sequentially on the top surface of the interlayer insulating film 21 containing the storage node contact plugs 25.

The capacitor oxide film 29 may be formed from phosphor silica glass (PSG), plasma-enhanced tetraethyl ortho silica (PE-TEOS), and combinations of the two.

Next, the capacitor oxide film 29 and the barrier film 27 are etched sequentially to a depth sufficient to form a trench (not shown) used for the capacitor. The etching is sufficient to expose the storage electrode contact plugs 25 a peripheral portion of and the interlayer insulating film 23.

FIG. 3b shows that a lower electrode 31 used as a storage node is then formed inside the trench. As illustrated, the lower electrode 31 also covers the capacitor oxide film 29.

FIG. 3c shows that the resultant structure of FIG. 3b undergoes a chemical mechanical polishing process or an etch back process to a depth sufficient to remove a portion of the lower electrode 31 and to expose the capacitor oxide film 29. Thus, an isolated lower electrode 31 used as a storage node is formed.

Figure 3D:
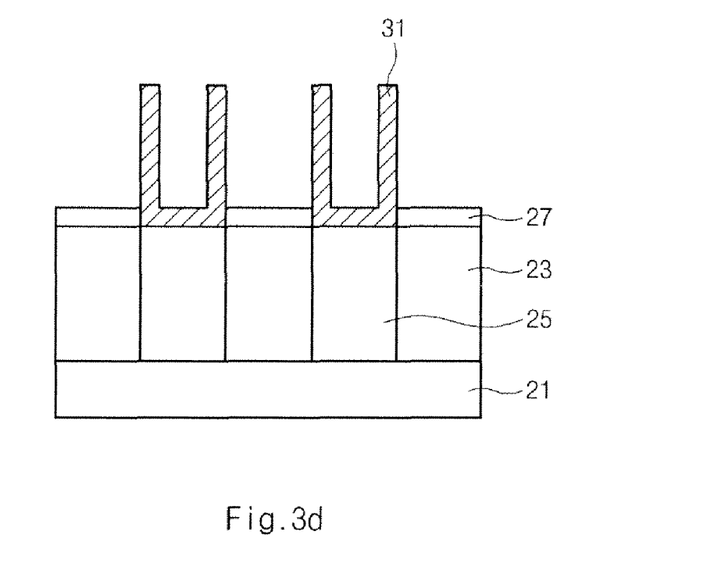

FIG. 3d illustrates the removal of the capacitor oxide film 29. To accomplish this, the resultant structure of FIG. 3c is immersed in and wet etched with the disclosed etching composition, for example for about 27 minutes. The structure is then immersed in an alcohol solution or placed in an alcohol vapor (e.g., isopropyl alcohol, methanol, ethanol and the like) in order to sufficiently rinse/remove the etching composition and any residual particles. The resultant structure is finally air dried at a temperature ranging from 10° C. to 70° C. to remove the capacitor oxide film 29. This prevents the leaning phenomenon in which the lower electrode 31 falls down.

In the process describe above, if the resultant structure is rinsed with water after wet-etching using the disclosed etching composition, it is not possible to prevent leaning of the lower electrode 31 because the surface tension of water is as high as 74 dyn/cm at a temperature of 23° C. On the contrary, it is possible to omit the rinse step using water. The rinse step using only an alcohol compound sufficiently rinses and removes the etching composition and any residual particles, because the disclosed etching composition has a low surface tension.

Because the falling force (F) is proportional to the surface tension of the etching composition, the surface tension of the etching composition is reduced to between 16 dyn/cm and 50 dyn/cm, preferably even down to between 16 dyn/cm and 25 dyn/cm. Selection of these parameters is remarkably effective in preventing the leaning of the lower electrode.

Examples of the disclosure are presented below. However, it is to be understood that the invention is not limited to the examples.

I. Preparation of Etching Compositions According to the Disclosure

Example 1

A 40 L composition consisting of ammonium fluoride (6 weight parts), methyl ammonium fluoride (10 weight parts), hydrofluoric acid (1 weight part), isopropyl alcohol (33 weight parts), and deionized water (50 weight parts) was prepared. Then, 15 g of a surfactant according to Formula 1 (where: R=octylpenyl; x, y, and z=1; and the average molecular weight=2,200), and 15 g of a surfactant according Formula 2 (having an average molecular weight=2,350) were combined with the 40 L composition to prepare an etching composition of the present disclosure. The resultant composition was filtered with a 0.2 μm PEFE filter to produce a final etchant.

Example 2

A 40 L composition consisting of ammonium fluoride (5 weight parts), hydrofluoric acid (1 weight part), ethyl ammonium fluoride (10 weight parts), methanol (34 weight parts), and deionized water (50 weight parts) was prepared. Then, 15 g of a surfactant according to Formula 1 (where: R=octylpenyl; x, y, and z=1; and the average molecular weight=2,200), and 15 g of a surfactant according to Formula 2 (average molecular weight=2,350) were combined with the 40 L composition to prepare an etching composition of the disclosed invention. The resultant composition was filtered with a 0.2 μm PEFE filter to produce a final etchant.

II. Surface Tension Measurements

Example 3

The surface tension of the etchant prepared by Example 1 was measured using a surface tension instrument (KRUSS K9). According to the measurement result, the etching composition of Example 1 had a surface tension of 20.2 dyn/cm at 23° C.

Example 4

The surface tension of the etchant prepared by Example 2 was measured using a surface tension instrument (KRUSS K9). According to the measurement result, the etching composition of Example 2 had a surface tension of 19.9 dyn/cm at 23° C.

III. Etching Process Using the Disclosed Etching Composition

Example 5

A barrier film and a PE-TEOS oxide film having a thickness of 13000 Å (capacitor oxide film) were sequentially formed over a semiconductor substrate having an interlayer insulating film containing contact plugs for use as storage nodes. The PE-TEOS oxide film and the barrier film were then etched sequentially to a depth sufficient to form a capacitor trench where the contact plugs and the interlayer insulating film at a peripheral portion thereof were exposed. A lower electrode used as a storage node was formed inside the trench.

Figure 4:
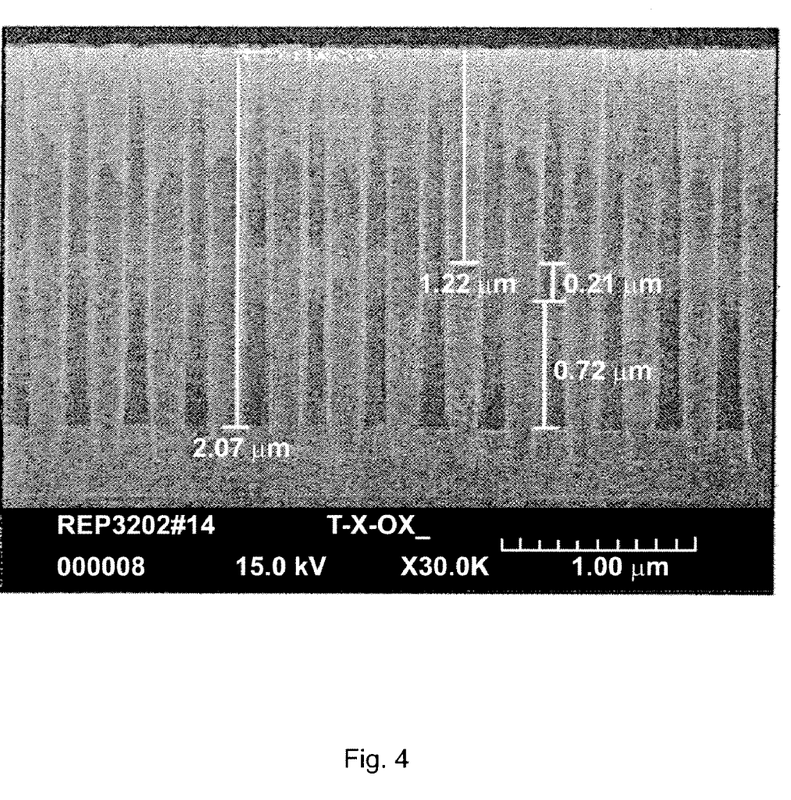
FIG. 4 is a TEM photograph illustrating the result of an etching process performed according to Example 5; and, FIG. 5 is a TEM photograph illustrating the result of an etching process performed according to Example 6.

Next, the semiconductor substrate was immersed in the composition of Example 1 for 27 minutes, rinsed with ethanol, and air dried. According to a TEM measurement of the semiconductor, the PE-TEOS oxide film was clearly removed (see FIG. 4), implying that an immersion time of 27 minutes was sufficient to remove the PE-TEOS oxide film having a thickness of 13000 Å. Moreover, the aspect ratio was 20.

Example 6

A barrier film and a PE-TEOS oxide film having a thickness of 13000 Å (capacitor oxide film) were sequentially formed over a semiconductor substrate having an interlayer insulating film containing contact plugs for use as storage nodes. The PE-TEOS oxide film and the barrier film were then etched sequentially to a depth sufficient to form a capacitor trench where the contact plugs and the interlayer insulating film at a peripheral portion thereof were exposed. A lower electrode used as a storage node was formed inside the trench.

Figure 5:
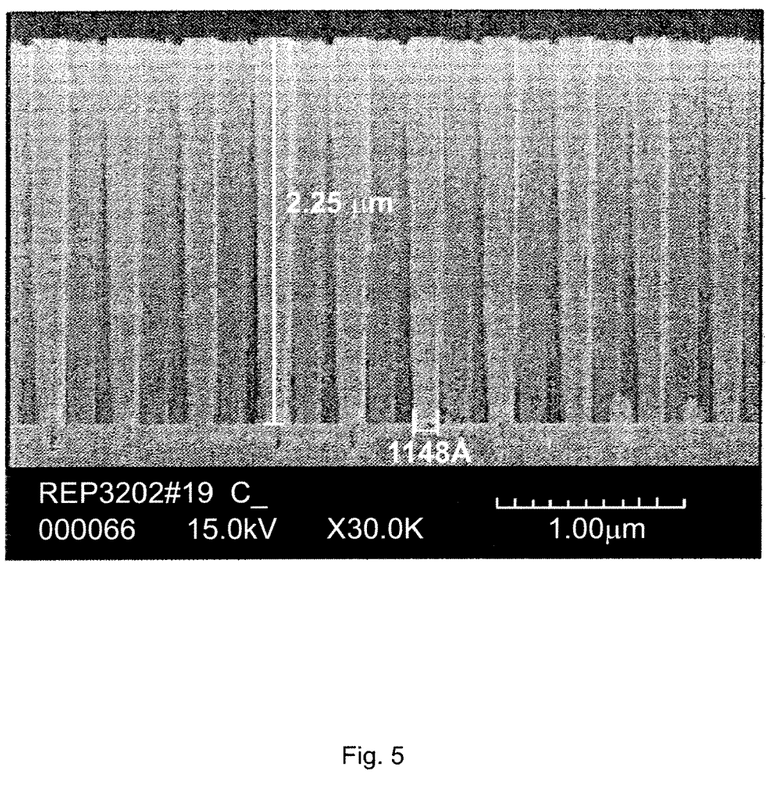

Next, the semiconductor substrate was immersed in the composition of Example 2 for 27 minutes, rinsed with ethanol, and air dried. According to a TEM measurement of the semiconductor, the PE-TEOS oxide film was clearly removed (see FIG. 5), implying that an immersion time of 27 minutes was sufficient to remove the PE-TEOS oxide film having a thickness of 13000 Å. Moreover, the aspect ratio was 20.

The disclosed method can effectively suppress the leaning phenomenon during the formation of capacitors, so that the height of the storage node of the capacitor can be secured. Further, capacitors with improved capacitance can be manufactured, and the process can be adapted to the production of both present and future devices.

Although a preferred embodiment of the disclosure has been described, it will be understood by those skilled in the art that the disclosure should not be limited to the described embodiment, but that various changes and modifications can be made within the spirit and scope of the disclosure as defined by the appended claims.

What is claimed is:

1. A method of manufacturing a capacitor, comprising the steps of:

forming a barrier film and a capacitor oxide film over a semiconductor substrate having an interlayer insulating film containing storage node contact plugs;

forming a trench by etching the capacitor oxide film and the barrier film to expose the storage node contact plugs;

forming a lower electrode used for a storage node inside the trench, thereby covering the capacitor oxide film;

forming an isolated lower electrode by removing a portion of the lower electrode until the capacitor oxide film is exposed;

removing the capacitor oxide film to expose the isolated lower electrode with an etching composition comprising hydrofluoric acid (HF), an alkyl ammonium fluoride ($R_eNH_4F$), a surfactant comprising a compound selected from the group consisting of Formula 1 and Formula 2, an alcohol compound, and water, wherein $R_e$ is a $C_1$–$C_{10}$ linear or branched alkyl;

rinsing the semiconductor substrate comprising the isolated lower electrode with an alcohol; and, drying the semiconductor substrate comprising the isolated lower electrode;

[Formula 1]

wherein R is a $C_8$-$C_{20}$ alkyl radical or a $C_6$-$C_{20}$ aromatic ring;

x, y, and z are independently integers ranging from 0 to 10;

n is an integer ranging from 3 to 50; and the average molecular weight of the compound according to Formula 1 ranges from 1,000 to 10,000,

[Formula 2]

wherein m is an integer ranging from 3 to 50; and the average molecular weight of the compound according to Formula 2 ranges from 1,000 to 10,000.

2. The method of claim 1, wherein the capacitor oxide film is a phosphor silica glass (PSG) or a plasma enhanced tetraethyl ortho silica (PE-TEOS).

3. The method of claim 1, wherein the step of isolating the lower electrode comprises performing a chemical mechanical polishing process or an etch back process.

4. The method of claim 1, wherein the step of rinsing the resultant structure comprises immersing the resultant structure in an alcohol solution or placing the resultant structure in an alcohol vapor.

5. The method of claim 1, wherein the step of drying the resultant structure comprises drying in air at a temperature ranging from 10° C. to 70° C.

6. The method of claim 1, wherein the etching composition further comprises one or more acid compounds selected from the group consisting of sulfuric acid, phosphoric acid, nitric acid, formic acid, and acetic acid.

7. The method of claim 1, wherein the hydrofluoric acid (HF) is present in an amount ranging from 0.1 weight part to 5 weight parts based on 100 weight parts of the etching composition.

8. The method of claim 1, wherein the ammonium fluoride ($NH_4F$) is present in an amount ranging from 1 weight part to 40 weight parts based on 100 weight parts of the etching composition.

9. The method of claim 1, wherein the alkyl ammonium fluoride ($R_eNH_3F$) is present in an amount ranging from 1 weight part to 40 weight parts based on 100 weight parts of the etching composition.

10. The method of claim 1, wherein the surfactant is present in an amount ranging from 100 ppm to 10000 ppm based the weight of the etching composition.

11. The method of claim 1, wherein the alcohol compound is present in an amount ranging from 1 weight part to 80 weight parts based on 100 weight parts of the etching composition.

12. The method of claim 1, wherein the water is present in an amount ranging from 20 weight part to 80 weight parts based on 100 weight parts of the etching composition.

13. The method of claim 1, wherein the surfactant is selected from the group consisting of non-ionic surfactants, cationic surfactants, anionic surfactants, and mixtures thereof.

14. The method of claim 1, wherein the etching composition has surface tension ranging from 16 dyne/cm to 50 dyne/cm at a temperature of 23° C.

15. The method of claim 14, wherein the etching composition has surface tension ranging from 16 dyne/cm to 25 dyne/cm at a temperature of 23° C.

* * * * *